(12) United States Patent
Baenisch et al.

(10) Patent No.: US 6,583,508 B2
(45) Date of Patent: Jun. 24, 2003

(54) INTEGRATED CIRCUIT WITH ACTIVE REGIONS HAVING VARYING CONTACT ARRANGEMENTS

(75) Inventors: Andreas Baenisch, Munich (DE); Sabine Kling, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/128,068

(22) Filed: Apr. 23, 2002

(65) Prior Publication Data

US 2002/0190278 A1 Dec. 19, 2002

(30) Foreign Application Priority Data

May 31, 2001 (DE) .......................................... 101 26 566

(51) Int. Cl.[7] .......................... H01L 23/48; H01L 23/52; H01L 29/40
(52) U.S. Cl. ........................................ 257/758; 257/211
(58) Field of Search ................................. 257/211, 758

(56) References Cited

U.S. PATENT DOCUMENTS 5,665,991 A * 9/1997 Efland et al. ................ 257/335
6,020,612 A 2/2000 Sawamura et al.

FOREIGN PATENT DOCUMENTS

| DE | 4115909 C1 | 11/1992 |
| DE | 19752014 A1 | 12/1998 |
| JP | 2000-307075 A | 2/2000 |

* cited by examiner

Primary Examiner—Wael Fahmy
Assistant Examiner—Howard Weiss
(74) Attorney, Agent, or Firm—Jenkins & Wilson, P.A.

(57) ABSTRACT

The present invention provides an integrated circuit with a plurality of active strip-shaped regions (S1, D1, S2, D2, S3) arranged in parallel next to one another; a contact level (K2) with a respective plurality of contacts (9'; 11, 12) arranged regularly in the longitudinal direction of the individual strip-shaped regions (S1, D1, S2, D2, S3); the contacts (9'; 11, 12) being arranged in the widthwise direction of the individual strip-shaped regions (S1, D1, S2, D2, S3) in such a way that the widthwise extent of corresponding contacts (9'; 11, 12) of neighboring regions varies.

8 Claims, 2 Drawing Sheets

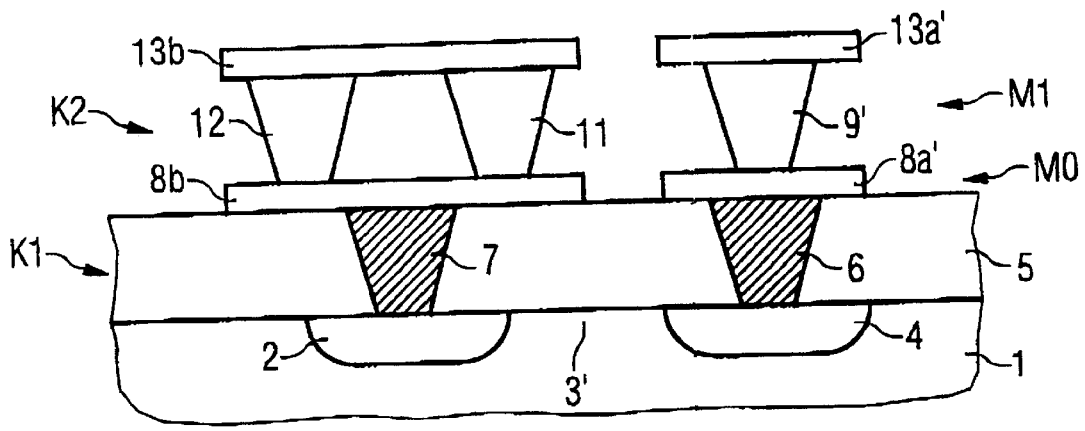
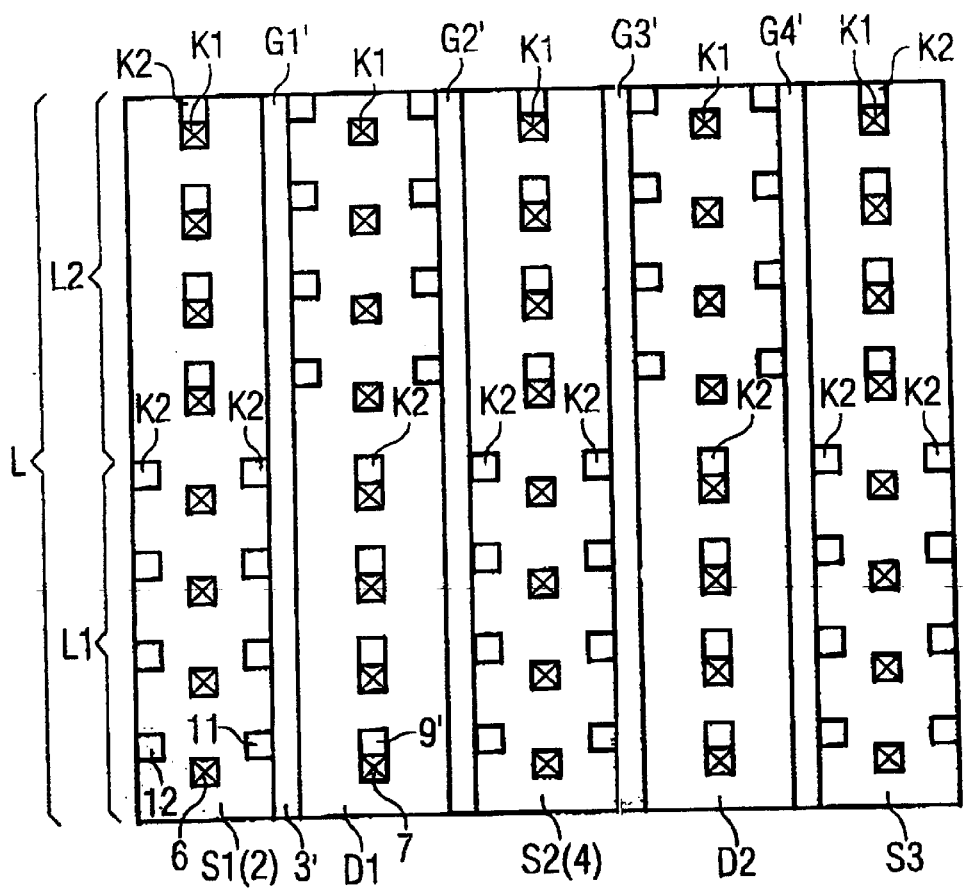

INTEGRATED CIRCUIT WITH ACTIVE REGIONS HAVING VARYING CONTACT ARRANGEMENTS

TECHNICAL FIELD

The present invention relates to an integrated circuit with a plurality of active strip-shaped regions arranged in parallel next to one another and a contact level with a respective plurality of contacts arranged regularly in the longitudinal direction of the individual strip-shaped regions.

BACKGROUND ART

Although in principle it can be applied to any desired integrated circuit, the present invention and the problems on which it is based are explained with respect to integrated OCD (Off Chip Driver) circuits in silicon technology.

FIG. 3 is a schematic lateral representation of a known integrated circuit in silicon technology.

In FIG. 3, reference numeral 1 designates a semiconductor substrate, for example a silicon semiconductor substrate. Integrated into the semiconductor substrate 1 are source/drain regions 2, 4 with a channel region 3 lying in between. When considered in plan view (cf. FIG. 4), the source/drain regions 2, 4 are elongate strips, which have on the substrate surface a substantially rectangular cross section, the strips being arranged parallel to one another.

Also with reference to FIG. 3, provided above the substrate surface is a first contact level K1, which has for each of the source/drain regions 2, 4 a plurality of contacts 6, 7 arranged regularly in the longitudinal direction. In the present example, the contacts 6, 7 lie substantially in the center of the strip-shaped source/drain regions 2, 4 and are spaced equidistantly apart. The contacts 6, 7 are embedded in an insulating layer 5, which consists for example of TEOS oxide.

Provided above the first contact level K1 is a first metallization level M0, which electrically connects the contacts 6, 7 to metal areas 8a, 8b, for example of tungsten, which are electrically isolated from one another. Provided above the metal level M0 is a second contact level K2, which in the present case respectively provides two contacts 9, 10 and 11, 12 above the corresponding contact of the first contact level K1, that is to say above the contacts 6, 7. A further insulating layer between the contacts 9, 10, 11, 12 is not shown for reasons of overall clarity.

Above the contact level K2 there lies a further metallization level M1, which brings together the contacts 9, 10 by means of the metal area 13a and the contacts 11, 12 by means of the metal area 13b.

FIG. 4 is a schematic plan-view representation of the known integrated circuit in silicon technology.

According to the representation of FIG. 4, in the present example 5 source/drain regions S1, D1, S2, D2, S3 are provided, the regions S1 and D1 corresponding to the regions 2 and 4 of FIG. 3. The length of the source/drain regions S1, D1, S2, D2, S3 will be designated hereafter by L. Provided between the source/drain regions S1, D1, S2, D2, S3 there is respectively a channel region with a gate terminal G1–G4 lying over it. The squares filled with a cross in FIG. 4 designate the upper view of the contacts of the first contact level K1 which, as already mentioned, lie substantially in the center of the widthwise extent of the respective source/drain regions S1, D1, S2, D2, S3.

The open squares in FIG. 4 designate the contacts of the second contact level K2, which are connected via the first metallization level M0 to the corresponding contacts of the first contact level K1. Consequently, in the present case, a specific contact of the first contact level K1 is respectively connected to two contacts lying above it of the second contact level K2, to be precise, according to the representation of FIG. 4, in each case to the nearest neighbor lying above it to the left and right. In FIG. 3, allowance is made for the fact that the contacts of the two contact levels K1, K2 are offset in relation to each other in the longitudinal direction, in that the contacts 6, 7 have a different hatching than the contacts 9, 10, 11 and 12.

The problems occurring in the case of the integrated circuit explained with reference to FIGS. 3 and 4 lie in the design rules for the configuration of the contacts and the configuration of the metallizations. In particular, problems arise in the case of the arrangement shown if the width of the channel region 3 or the gates G1–G4 lying over it is reduced. As from a certain width, the nearest neighboring contacts of two neighboring source/drain regions of the second contact level K2 then collide.

This problem could be easily solved by in each case only every second strip-shaped source/drain region S1, D1, S2, D2, S3 having double contacts in the second contact level K2, i.e. if the source/drain regions alternately contained two contacts and then one contact in the second contact level K2. However, this is disadvantageous inasmuch as each source/drain region is to be uniformly connected to the power supply, i.e. each source/drain region has a substantially equal output and input resistance. A symmetry of the source/drain regions is also desirable with regard to electrical bonding, in order that a substantially homogeneous current density distribution is obtained over the surface area of the entire source/drain regions.

SUMMARY OF THE INVENTION

It is therefore an object of the present invention to provide a corresponding integrated circuit, it being possible to provide a plurality of contacts distributed over the width in the second contact level without problems occurring in respect of the narrowing of the channel regions.

This object is achieved according to the invention by the integrated circuit disclosed herein.

The idea on which the present invention is based is that the contacts are arranged in the widthwise direction of the individual strip-shaped regions in such a way that the widthwise extent of corresponding contacts of neighboring regions varies.

One advantage which the circuit according to the invention has over the known approach to a solution is that, in spite of a reduction in the dimensions, a symmetry of the contacts and an equal number of them can be retained for each active region.

Advantageous developments and improvements of the subject matter of the invention can be found in the subclaims.

According to a preferred development, the contacts of the strip-shaped regions have a first widthwise extent over a first length and a second widthwise extent over a second length.

According to a further preferred development, the widthwise extent of corresponding contacts of a first neighboring strip and a second neighboring strip amounts to two contacts over the first length and one contact over the second length in the case of the first strip and amounts to two contacts over the second length and one contact over the first length in the case of the second strip.

According to a further preferred development, the contacts with the widthwise extent of one contact are arranged substantially in the middle of the width of the respective region.

According to a further preferred development, the strip-shaped regions are source/drain regions of field-effect transistors, which are introduced into a semiconductor substrate with respective channel regions lying in between.

According to a further preferred development, a further contact level, which lies under the contact level and has a respective plurality of contacts arranged regularly in the longitudinal direction of the individual strip-shaped regions, is provided, the contacts of the further contact level having a widthwise extent of one contact.

According to a further preferred development, the two contact levels are interconnected via a metal level lying in between.

According to a further preferred development, the number of contacts of each of the strip-shaped regions is equal.

According to a further preferred development, certain contacts of the contact level of a strip-shaped region lie above a neighboring strip-shaped region.

According to a further preferred development, the strip-shaped regions are substantially rectangular.

BRIEF DESCRIPTION OF THE DRAWINGS

An exemplary embodiment of the invention is explained in more detail in the following description and is represented in the drawings, in which:

FIG. 1 shows a schematic lateral representation of an integrated circuit in silicon technology as an embodiment of the present invention;

FIG. 2 shows a schematic plan-view representation of an integrated circuit in silicon technology of the embodiment of the present invention;

DETAILED DESCRIPTION OF THE INVENTION

FIG. 1 is a schematic lateral representation of an integrated circuit in silicon technology as an embodiment of the present invention, and FIG. 2 is a schematic plan-view representation of an integrated circuit in silicon technology of the embodiment of the present invention.

Figure 3:
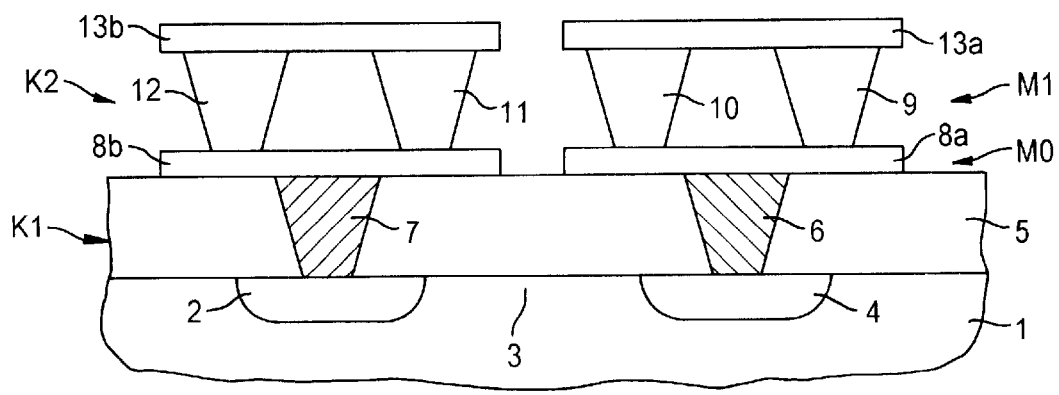
FIG. 3 shows a schematic lateral representation of a known integrated circuit in silicon technology.
Figure 4:
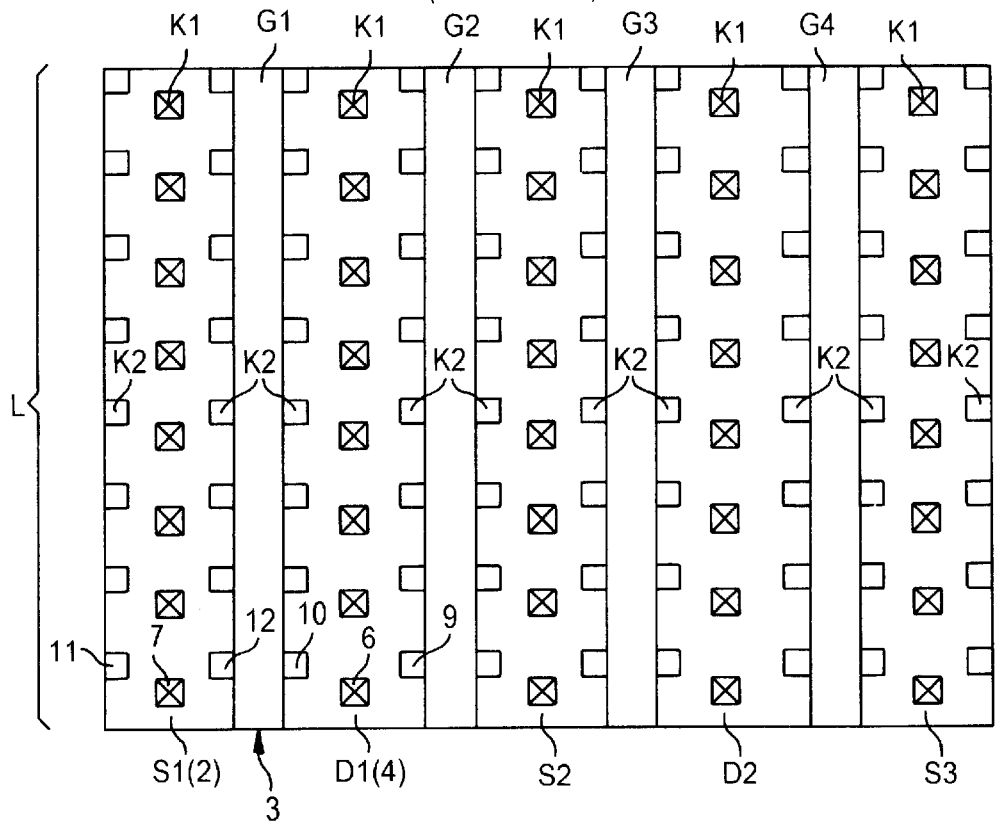
FIG. 4 shows a schematic plan-view representation of the known integrated circuit in silicon technology.

In the case of the embodiment of the present invention shown in FIG. 1, the same reference numerals as in FIGS. 3 and 4 designate identical or functionally identical component parts.

The arrangement of the source/drain regions 2, 4 according to FIG. 1 is identical to that in FIG. 3. Only the channel region 3' lying in between is shown narrowed. The contacts 6, 7 of the first contact level K1 and the metal areas 8$a$' and 8$b$' of the first metal level M0 accordingly lie closer together.

As a difference from the known integrated circuit according to FIG. 3, in this example not every contact of the first contact level K1 is assigned two contacts of the second contact level K2, but instead there is provided a symmetrical structure in which, for each of the source/drain regions, S1, D1, S2, D2, S3, precisely two contacts are provided in the second contact level K2 for each of the contacts in the first contact level K1 over a first part-length S1 of the strip length L, here precisely half. In the second part-length L2, here the other half, in each case only one contact is provided in the second contact level K2 for each contact in the first contact level K1.

In a way corresponding to this, the neighboring source/drain region, here for example the source/drain region D1, has the same contact structure as the source/drain region S1(2), but offset in a mirror-inverted manner.

In other words, where in the source-drain region S1 two contacts are provided in the second contact level, the structure above D1 has only one contact in the second contact level K2, and has two contacts in the second contact level where in the first source/drain region S1(2) only one contact is provided in the second contact level. The produces a symmetrical structure which allows a "closer together arrangement" by narrowing of the channel length. Equally, the contacts of the second contact level in this example are nested in one another, and it is even possible for contacts of the second contact level K2 which belong to the source/drain region S1 to lie above the source/drain region D1.

All the source/drain regions have in this new structure the same number of supply contacts, which results in equal input and output resistances. There is also complete symmetry of the source/drain regions in relation to one another, and consequently there is the favorable current density distribution referred to.

Although the present invention was described above on the basis of a preferred exemplary embodiment, it is not restricted to this but can be modified in a wide variety of ways.

In particular, the explanation in connection with integrated driver circuits in silicon technology is given only by way of example.

It goes without saying that the present invention is not restricted to the contact structure of the second contact level specified above by way of example. For example, a tooth-like interengagement of the contacts of the second contact level is conceivable. It is also possible, if there is appropriate space, for a larger number of contacts to be provided in the second contact level for each contact in the first contact level. What is important is that the contacts are arranged in the widthwise direction of the individual strip-shaped regions in such a way that the widthwise extent of corresponding contacts of neighboring source/drain regions varies, so that an overlapping or intermeshing is possible.

| List of designations | |
|---|---|
| 1 | substrate |
| 2, 3 | active regions |
| S1–S3 | source regions |
| D1, D2 | drain regions |
| 3, 3' | channel region |
| K1, K2 | contact levels |
| M0, M1 | metal levels |
| 6, 7, 9, 9', 11, 12 | contacts |
| 5 | insulating layer |
| 8a, 8a', 8b, 13a, 13a', 13b | metal areas |
| G1–G4 | gate regions |
| L, L1, L2 | portions of length |

What is claimed is:

1. Integrated circuit with active regions having varying contact arrangements with:

a plurality of active strip-shaped regions arranged in parallel next to one another, each region having a first length and a second length along a longitudinal direction;

a contact level with a respective plurality of contacts arranged regularly in the longitudinal direction of the individual strip-shaped regions;

wherein the contacts in each region have a first widthwise extent over the first length and a second widthwise extent over the second length; and wherein the widthwise extent of corresponding contacts of a first neighboring region and a second neighboring region amounts to two contacts over the first length and one contact over the second length in the case of the first region and amounts to two contacts over the second length and one contact over the first length in the case of the second region.

2. Integrated circuit according to claim 1, wherein the contacts with the widthwise extent of one contact are arranged substantially in the middle of the width of the respective region.

3. Integrated circuit according to claim 1, wherein the strip-shaped regions are source/drain regions of field-effect transistors, which are introduced into a semiconductor substrate with respective channel regions lying in between.

4. Integrated circuit according to claim 1, wherein a further contact level, which lies under the contact level and has a respective plurality of contacts arranged regularly in the longitudinal direction of the individual strip-shaped regions, is provided, the contacts of the further contact level having a widthwise extent of one contact.

5. Integrated circuit according to claim 4, wherein the two contact levels are interconnected via a metal level lying in between.

6. Integrated circuit according to claim 1, wherein the number of contacts of each of the strip-shaped regions is equal.

7. Integrated circuit according to claim 1, wherein certain contacts of the contact level of a strip-shaped region lie above a neighboring strip-shaped region.

8. Integrated circuit according to claim 1, wherein the strip-shaped regions are substantially rectangular.

* * * * *